(12) United States Patent
Spick et al.

(10) Patent No.: US 10,865,590 B2
(45) Date of Patent: Dec. 15, 2020

(54) METHOD FOR DETECTING APPROACH AND/OR CONTACT OF THE HAND OF A USER CLOSE TO A DOOR HANDLE OF A MOTOR VEHICLE, ASSOCIATED CAPACITIVE SENSOR AND DETECTION MODULE

(71) Applicants: Continental Automotive France, Toulouse (FR); Continental Automotive GmbH, Hannover (DE)

(72) Inventors: Gabriel Spick, Toulouse (FR); Olivier Gerardiere, Tournefeuille (FR); Carlos Eduardo Rodrigues, Toulouse (FR)

(73) Assignees: Continental Automotive France; Continental Automotive GmbH

( * ) Notice: Subject to any disclaimer, the term of this patent is extended or adjusted under 35 U.S.C. 154(b) by 115 days.

(21) Appl. No.: 16/341,634

(22) PCT Filed: Nov. 28, 2017

(86) PCT No.: PCT/FR2017/053271
§ 371 (c)(1),
(2) Date: Apr. 12, 2019

(87) PCT Pub. No.: WO2018/100282
PCT Pub. Date: Jun. 7, 2018

(65) Prior Publication Data
US 2019/0383065 A1    Dec. 19, 2019

(30) Foreign Application Priority Data
Nov. 29, 2016 (FR) ..................... 16 61656

(51) Int. Cl.
*E05B 81/64* (2014.01)
*E05B 81/76* (2014.01)
*H03K 17/955* (2006.01)

(52) U.S. Cl.
CPC .............. *E05B 81/64* (2013.01); *E05B 81/77* (2013.01); *H03K 17/955* (2013.01);
(Continued)

(58) Field of Classification Search
CPC .......... E05B 81/64; E05B 81/76; E05B 81/77; E05B 81/78; H03K 17/955; H03K 17/962; H03K 2217/96071
See application file for complete search history.

(56) References Cited

U.S. PATENT DOCUMENTS 8,040,142 B1    10/2011    Bokma et al.
8,775,103 B1 *  7/2014    Jayaraj ................. H03K 17/955
                                                                702/57
(Continued)

FOREIGN PATENT DOCUMENTS

EP    2416181 A2    2/2012
FR    2853058 A1    10/2004
(Continued)

OTHER PUBLICATIONS

International Search Report and Written Opinion for International Application No. PCT/FR2017/053271, dated Feb. 9, 2018—9 pages.
(Continued)

*Primary Examiner* — Christopher E Mahoney
(74) *Attorney, Agent, or Firm* — RatnerPrestia

(57) ABSTRACT

A method for detecting the approach and/or contact of a user's hand close to a motor vehicle door handle. The handle including: an electrode having a capacitance, and a device for measuring the variation in capacitance, a low-frequency antenna situated close to the electrode, the emissions of the low-frequency antenna bringing about disturbances in the operation of the device for measuring the variation in the capacitance. The method proposes that a new adaptive approach detection threshold be calculated, depending on an average of the previous measured variations in the capacitance, calculated over a predetermined time interval, the measured variations being weighted by a factor depending on a difference between each measured variation and the average of the variations calculated previously over a pre-
(Continued)

vious predetermined time interval, the approach detection being confirmed if the measured variation is higher than the new adaptive threshold.

9 Claims, 3 Drawing Sheets

(52) U.S. Cl.
CPC ....... *E05Y 2400/86* (2013.01); *E05Y 2900/50* (2013.01); *H03K 2217/94026* (2013.01)

(56) References Cited

U.S. PATENT DOCUMENTS

| | | | |
|---|---|---|---|
| 9,689,659 B2 | 6/2017 | Teissier et al. | |
| 9,689,907 B2 | 6/2017 | Hourne | |
| 2007/0008235 A1* | 1/2007 | Tsukahara | H01Q 1/3241 343/788 |
| 2017/0030119 A1* | 2/2017 | Usui | E05B 85/10 |
| 2018/0331706 A1* | 11/2018 | Nys | H03K 17/955 |

FOREIGN PATENT DOCUMENTS

| | | | |
|---|---|---|---|
| FR | 2999833 A1 | 6/2014 | |
| WO | 2016058656 A1 | 4/2016 | |

OTHER PUBLICATIONS

English Translation of the Written Opinion for International Application No. PCT/FR2017/053271, dated Feb. 9, 2018—8 pages.

\* cited by examiner

METHOD FOR DETECTING APPROACH AND/OR CONTACT OF THE HAND OF A USER CLOSE TO A DOOR HANDLE OF A MOTOR VEHICLE, ASSOCIATED CAPACITIVE SENSOR AND DETECTION MODULE

CROSS REFERENCE TO RELATED APPLICATIONS

This application is the U.S. National Phase Application of PCT International Application No. PCT/FR2017/053271, filed Nov. 28, 2017, which claims priority to French Patent Application No. 1661656, filed Nov. 29, 2016, the contents of such applications being incorporated by reference herein.

FIELD OF THE INVENTION

The invention relates to a method for detecting the approach and/or contact of a user's hand close to a motor vehicle door handle, and to an associated capacitive sensor and detection module. The invention applies more particularly to a method for detecting the approach and/or contact of a user toward a motor vehicle door handle.

BACKGROUND OF THE INVENTION

Nowadays, some motor vehicles are equipped with "hands-free" access. This means that the authorized user of the vehicle no longer needs a key to open the doors and other opening elements (hood, trunk, etc.) of his vehicle. Instead of a key, he has an identification fob (or remote controller) with which the vehicle electronic system interacts.

To request opening of a door, for example, the user approaches the handle of the door. A capacitive presence sensor situated in the handle detects the presence of the user's hand. This sensor is connected to the electronic computer of the vehicle (ECU: abbreviation for "electronic control unit") and sends it a presence detection signal. The electronic computer of the vehicle has, beforehand, identified the user as being authorized to access this vehicle, or alternatively, following the reception of this detection signal, it performs this identification. To this end, it sends an identification request to the fob (or to the remote controller) carried by the user by way of an LF (abbreviation for "low-frequency") antenna. This LF antenna is also situated in the door handle in which the capacitive presence sensor is located. The fob in response sends its identification code to the electronic computer of the vehicle through RF (radiofrequency) waves. If the electronic computer recognizes the identification code as the one authorizing access to the vehicle, it triggers opening of the door. If, on the other hand, the electronic computer has not received any identification code or if the received identification code is erroneous, opening is not performed.

Such a capacitive sensor C consists of an electrode 40 of capacitance Ce (cf. FIG. 1) integrated into the handle P of the door of the vehicle V and a device 60 for measuring the variation in the capacitance Ce. The capacitance Ce varies depending on the approach of the user's hand toward the handle P.

The measurement device 60 takes the form for example of a relaxation oscillator, that is to say an oscillator whose frequency variation makes it possible to determine the value of the variation in the capacitance Ce, integrated into a microcontroller 80. It may also take the form of a capacitive divider bridge between a capacitor Ce whose value varies and a charging capacitor into which the capacitor Ce discharges.

The measurement device 60 provides, at output, a signal representative of the variation in the capacitance Ce.

Such a device 60 for measuring the capacitance Ce is known to those skilled in the art and is described in published patent application FR 2 999 833 A1, which is incorporated by reference herein.

Other devices for measuring the variation in capacitance Ce are known to those skilled in the art.

The approach and/or contact detection is confirmed when a signal N representative of the variation in capacitance Ce moves above an adaptive threshold Nth.

Said adaptive threshold Nth is calculated from the average of the signal N of variation in capacitance Ce calculated at a previous instant of predetermined duration $\Delta t$ to which a detection margin is added. For example, $\Delta t$ is equal to three seconds, and at the instant t (s), the adaptive threshold Nth is calculated by taking the average of the values of the signal Nth during the predetermined duration $\Delta t$ that has elapsed in the last 3 seconds, that is to say between (t−3) and t (in seconds), to which a fixed detection margin A is added.

The adaptive threshold is therefore calculated at a set frequency, for example every 3 seconds, from the average of the values of the signal N, over the last 3 seconds that have elapsed.

Said adaptive threshold Nth exhibits the advantage of avoiding false detections. Specifically, in the case of a set threshold, in the event of noise on the signal Nth, the signal N could momentarily move above the set threshold.

The adaptive threshold Nth also makes it possible to adapt to variations in the signal N that are caused by environmental changes, for example temperature or humidity increases.

The use of an adaptive threshold makes it possible to avoid this drawback, specifically in the case of noise impacting the signal N, and the adaptive threshold Nth also adapts proportionally to the drift of the signal N. The adaptive threshold Nth thus remains above the signal N, except for in the event of approach of the user's hand, in which case the variation in the signal N is more abrupt, and the signal N moves above the adaptive threshold Nth, and the approach detection is confirmed.

By using the adaptive threshold Nth, all that are then detected are the approaches of the user's hand that cause the value of the signal N to vary to an extent sufficient that said signal N crosses the adaptive threshold Nth.

This is illustrated in FIG. 2.

The measured signal N of variation in the capacitance Ce is shown as a function of time t. Said signal N undergoes a strong variation when a hand M approaches toward the handle P. More precisely, the signal N increases considerably when the user's hand M approaches.

At t0, the signal N moves above the adaptive threshold Nth, and the approach detection is confirmed.

The adaptive threshold Nth, for its part, also increases with a delay less than or equal to the predetermined duration $\Delta t$.

However, for some vehicles V, some functions are activated even before the presence of the user is detected close to the handle P by the capacitive sensor.

These functions may be for example starting certain lighting devices, or turning on the dashboard as soon as a user has been authenticated by the vehicle V by way of his fob, that is to say as soon as the identifier of the fob has been recognized by an or the LF antenna(s) A of the vehicle V within a predetermined radius around said vehicle V.

For these vehicles, the LF antenna A situated in the door handle P (see FIG. 1) of the vehicle V periodically checks for the presence of a fob identifier compatible with the vehicle V by therefore periodically emitting electromagnetic waves, even before the approach of the user's hand M is detected close to the door handle P.

Now, the operation of the LF antenna A, situated close to the electrode 40, generates false approach and/or contact detections by the capacitive sensor C.

The signal N, when it is disturbed by the LF antenna A, drops considerably for a short period. Of course, the example illustrated is in no way limiting, and some LF antenna A disturbances may lead to a considerable and one-off increase in the signal N.

This is also the case for any other strong electromagnetic disturbances having a different origin.

This is illustrated in FIG. 3. At the instant to, an electromagnetic disturbance I on the capacitive sensor brings about a considerable drop in the variation in capacitance Ce signal N.

At the end of the predetermined period, $\Delta t$, the adaptive threshold Nth reacts and also drops. As the electromagnetic disturbance I is untimely and of a short duration, the signal N quickly returns to a nominal value No, during the predetermined duration $\Delta t$.

However, the result of this is that the adaptive threshold Nth, taking into account this strong and untimely drop, moves below the signal N at the instant t1.

The approach detection is therefore confirmed at the instant t1. Now, this does not involve an increase in the signal N corresponding to the approach of a hand, but to the abnormal drop in the adaptive threshold Nth stemming from a strong disturbance on the signal N.

If the electromagnetic disturbance brings about a considerable and one-off increase in the signal N, the value of the adaptive threshold Nth is also "artificially" increased, and the sensor C is then less sensitive.

This leads to false approach detections and therefore untimely locking or unlocking of the door of the vehicle V, especially when a compatible fob has been identified around the vehicle V.

SUMMARY OF THE INVENTION

To this end, an aspect of the invention proposes an approach and/or contact detection method that does not have the drawbacks of the prior art, in this case by making the capacitive sensor insensitive to any electromagnetic disturbance.

An aspect of the invention proposes a method for detecting the approach and/or contact of a user's hand close to a motor vehicle door handle, said handle comprising:
  an electrode having a capacitance, and
  a device for measuring the variation in said capacitance,
  a low-frequency antenna situated close to the electrode,
    the emissions of said low-frequency antenna bringing about disturbances in the operation of the device for measuring the variation in the capacitance,
the method being noteworthy in that a new adaptive approach detection threshold is calculated, depending on an average of the previous measured variations in said capacitance, calculated over a predetermined time interval, said measured variations being weighted by a factor depending on a difference between each measured variation and the average of the variations calculated previously over a previous predetermined time interval, the approach detection being confirmed if the measured variation in said capacitance is higher than the new adaptive threshold.

Expediently, the new adaptive threshold is calculated at a set frequency.

According to a first embodiment, the predetermined time interval and the previous predetermined time interval have equal durations between them.

An aspect of the invention also relates to any capacitive sensor for detecting the approach and/or contact of a user's hand toward a motor vehicle door handle, said sensor comprising:
  an electrode having a capacitance, and
  a device for measuring the variation in said capacitance,
  a low-frequency antenna situated close to the electrode,
    the emissions of said low-frequency antenna bringing about disturbances in the operation of the device for measuring the variation in the capacitance,
said sensor being noteworthy in that it additionally comprises:
  means for calculating a new adaptive approach detection threshold depending on an average of the measured variations in said capacitance, calculated over a time interval, said measured variations being weighted by a factor depending on a difference between each measured variation and the average of the measured variations calculated previously over a previous predetermined time interval,
  means for comparing between the variation in said capacitance and the adaptive threshold in order to confirm the approach detection
in order to confirm the approach detection.

An aspect of the invention also applies to any module for detecting the approach and/or contact of a user's hand toward a motor vehicle door handle, said module comprising:
  a capacitive sensor comprising:
    an electrode having a capacitance, and
    a device for measuring the variation in said capacitance, and
  a low-frequency antenna situated close to the electrode,
    the emissions of said low-frequency antenna bringing about disturbances in the operation of the device for measuring the variation in the capacitance,
said module being noteworthy in that it furthermore comprises:
  means for calculating a new adaptive approach detection threshold depending on an average of the measured variations in said capacitance, calculated over a time interval, said measured variations being weighted by a factor depending on a difference between each measured variation and the average of the measured variations calculated previously over a previous predetermined time interval,
  means for comparing between the variation in said capacitance and the adaptive threshold in order to confirm the approach detection
in order to confirm the approach detection.

Advantageously, the calculating means and the comparison means take the form of software integrated into a microcontroller.

An aspect of the invention also relates to any motor vehicle comprising a sensor or a module according to one of the features listed above.

BRIEF DESCRIPTION OF THE DRAWINGS

Other aims, features and advantages of aspects of the invention will become apparent on reading the following description, by way of nonlimiting example and on examining the appended drawings, in which.

DETAILED DESCRIPTION OF THE PREFERRED EMBODIMENTS

As explained above, the capacitive sensor C from the prior art, when it is located close to an LF antenna A, is liable to be disturbed by the electromagnetic waves emitted by said LF antenna A. This results in an error in the measured variations in the capacitance Ce, that is to say in the signal N, in turn leading to an error in the adaptive threshold Nth. The disturbances are reflected by abrupt and strong drops in the signal N, which, when the adaptive threshold Nth is updated, therefore cause the value of said adaptive threshold Nth to drop (the adaptive threshold Nth being updated or calculated at a set frequency, for example every 3 seconds). As soon as the disturbance stops and the signal N returns to an undisturbed value (i.e.: the nominal value before the disturbance), it exceeds the adaptive threshold Nth, when the latter is updated, and an approach detection is confirmed, even though the crossing of the adaptive threshold by the signal N is in fact due to an untimely drop in the signal N due to strong electromagnetic disturbance and to an actual approach.

As explained above, in the event of stray disturbances bringing about a one-off increase in the signal N, the adaptive threshold Nth also increases and the sensor C then becomes less sensitive to the approach of a user's hand.

The aspect of the invention aims to rectify these problems.

The example below is given for a capacitive sensor measuring the variation in capacitance Ce by way of a capacitive bridge, in which the capacitor Ce is connected in parallel with a charging capacitor Cs and a discharging capacitor discharging at a set frequency into the charging capacitor Cs.

An aspect of the invention however remains applicable to any sensor C technology that measures the variation in capacitance Ce, for producing a signal N representative of the number of charges and discharges, by appropriately adjusting the value of the constant A (explained further below).

Figure 1:
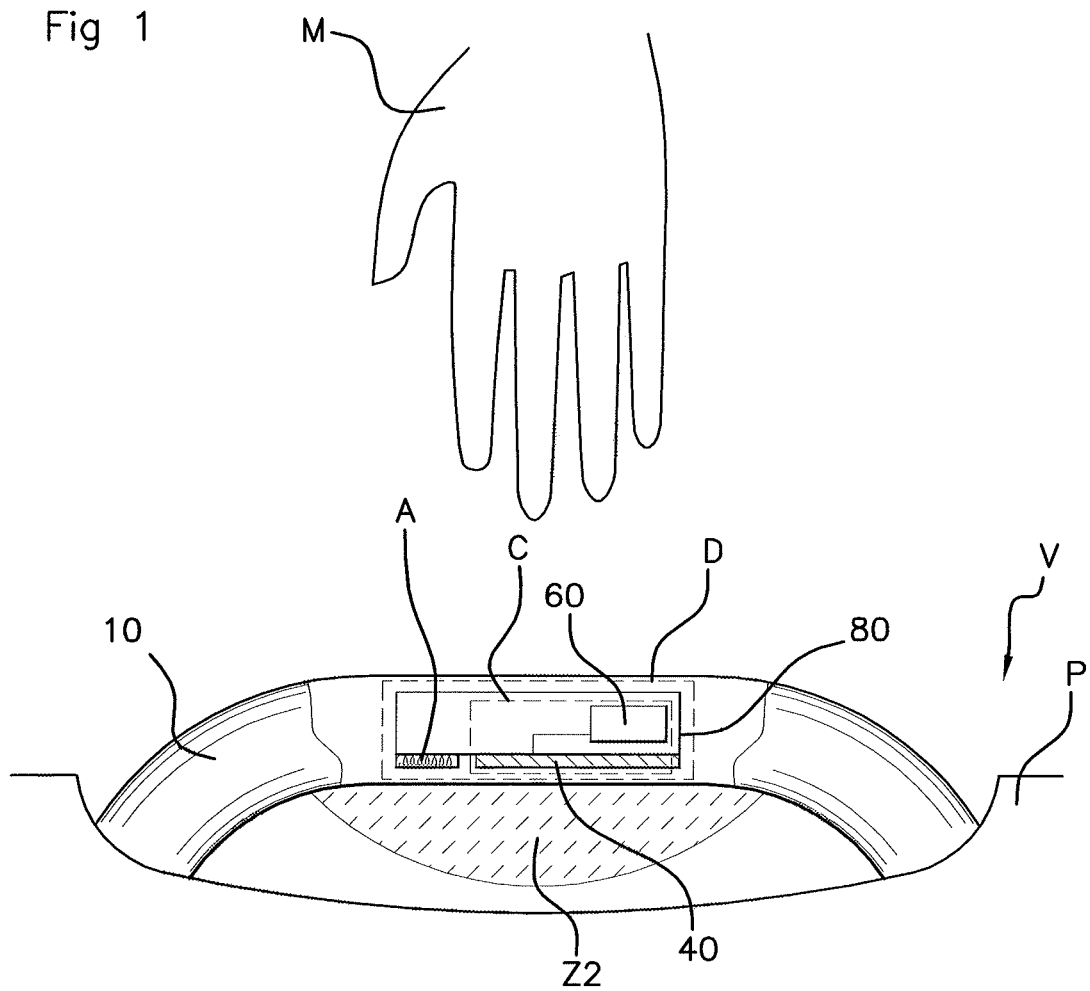
FIG. 1 (already commented upon) schematically shows a handle 10 comprising an LF antenna A and a capacitive sensor C integrated into a printed circuit 80, comprising an electrode 40 and a measurement device 60 according to the prior art, FIG. 2 (already commented upon) is a graph showing the variation in the capacitance Ce as a function of time and the detection of the approach of a hand, when the variation in capacitance moves above the adaptive threshold Nth, FIG. 3 (already commented upon) is a graph showing the variation in capacitance Ce when there is an electromagnetic disturbance I and the false approach detection, when the variation in capacitance moves above the adaptive threshold Nth, FIG. 4 schematically shows the module D comprising the capacitive sensor C and the antenna A according to an aspect of the invention.
Figure 2:
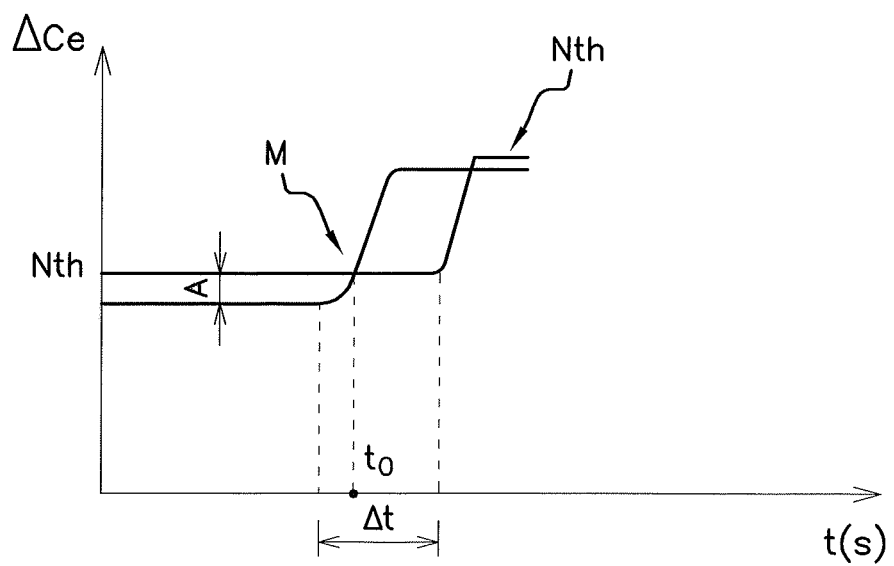
Figure 3:
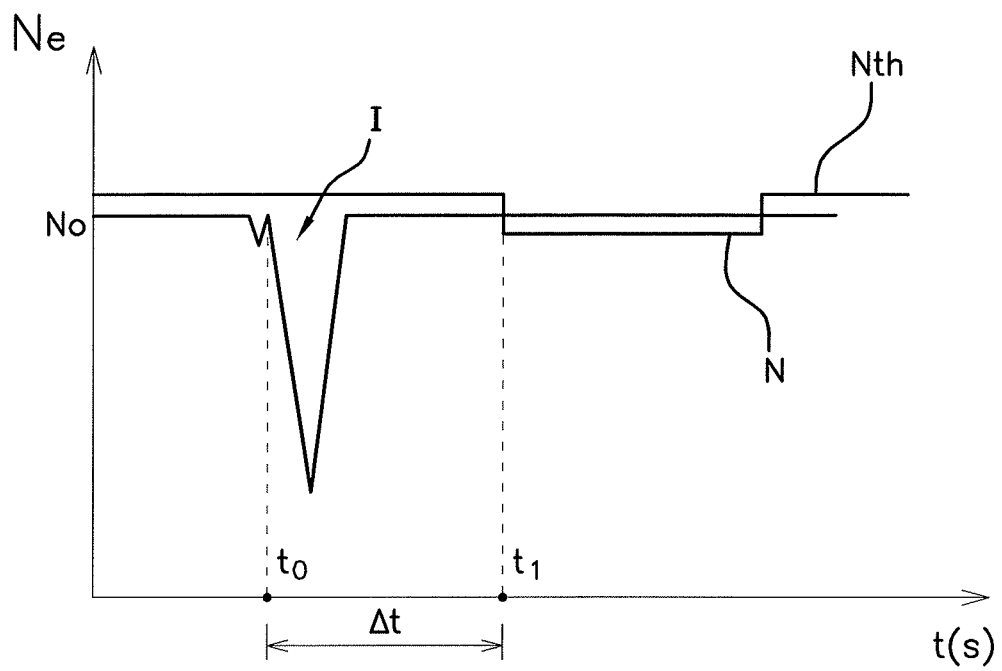
Figure 4:
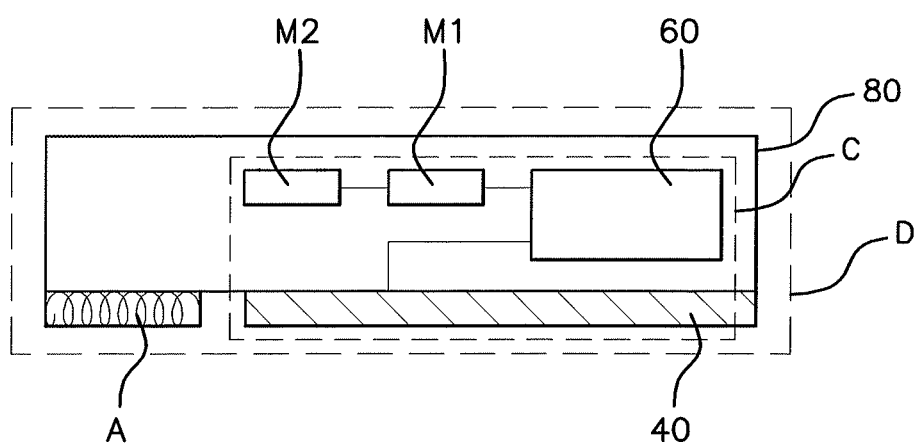

The sensor C according to an aspect of the invention is shown in FIG. 4. Said sensor C comprises, as in the prior art, an electrode 40 and means 60 for measuring the variation in capacitance Ce of said electrode 40.

An aspect of the invention proposes for the sensor C to furthermore comprise:
means M1 for calculating a new adaptive threshold Nth',
means M2 for comparing between said new adaptive threshold Nth' and the variation in capacitance Ce in order to confirm the detection of the approach of the user's hand M toward the door P handle 10.

The approach detection module D according to an aspect of the invention therefore comprises the sensor C such as defined above, that is to say comprising the calculating means M1 and the comparison means M2, as well as a low-frequency antenna A situated close to the electrode 40, the emissions of said low-frequency antenna A, as explained above, bringing about disturbances in the operation of the device 60 for measuring the variation in the capacitance Ce.

The new adaptive threshold Nth' according to an aspect of the invention is calculated from an average of the previous variations in said capacitance Ce, calculated during a predetermined duration Δt', said variations being weighted by a factor W depending on a difference between each variation and the previously calculated average of the variations, that is to say the second-to-last calculated average.

Figure 5:
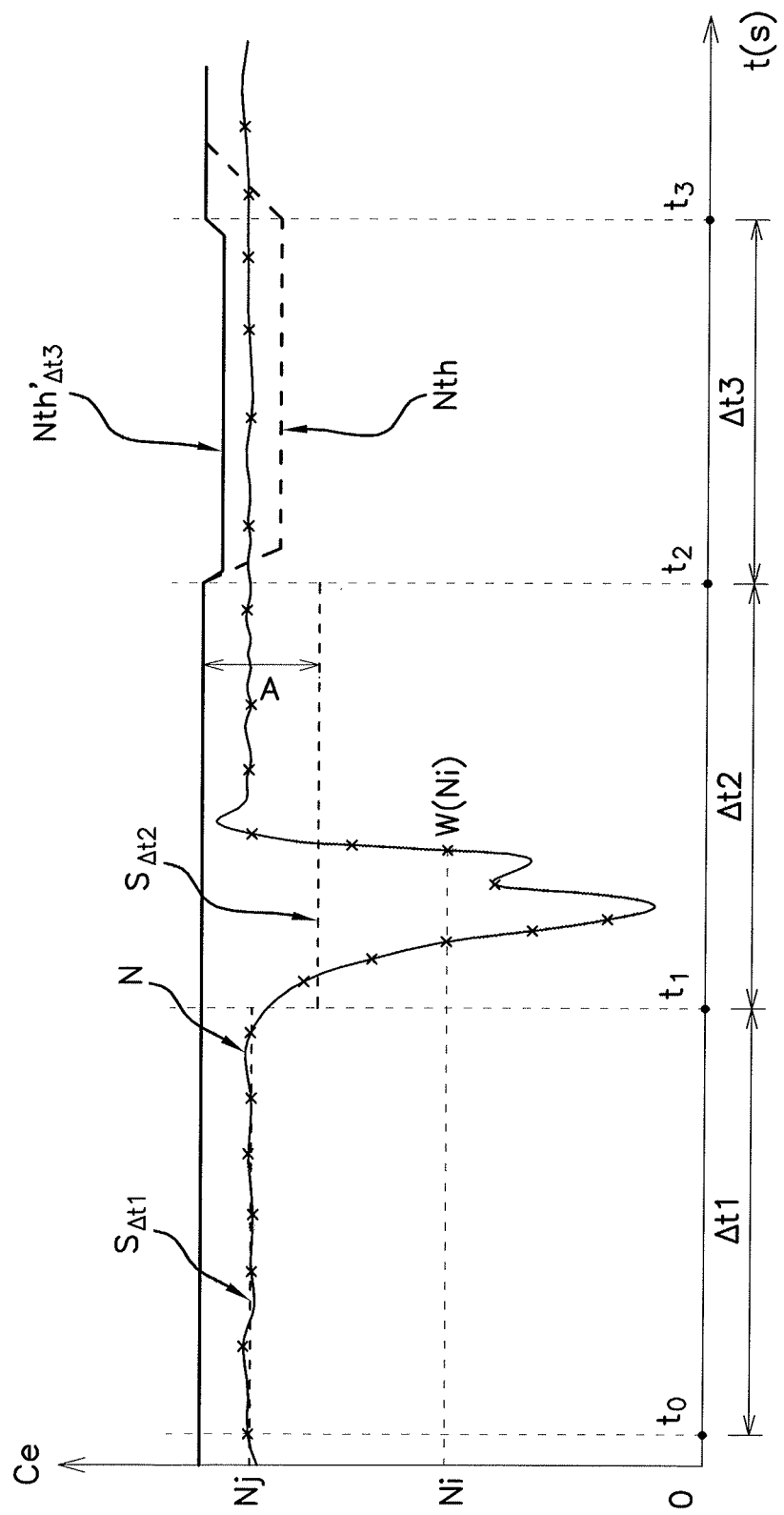
FIG. 5 is a graph showing the variation in capacitance Ce when there is an electromagnetic disturbance I and the new adaptive threshold Nth', according to an aspect of the invention, illustrating the absence of false approach detection.

This is illustrated in FIG. 5.

$$Nth'_{\Delta tk} = S_{\Delta t(k-1)} + A$$

Where:

$$S_{\Delta t(k-1)} = \frac{\sum_{i=1}^{x} [W(Ni) \times Ni]}{\sum_{i=1}^{x} W(Ni)}$$

$$W(Ni) = 1 - \frac{1}{K} \times \left| \frac{Ni - S_{\Delta t(k-2)}}{S_{\Delta t(k-2)}} \right|$$

And:

$$S_{\Delta t(k-2)} = \frac{\sum_{j=1}^{z} [W(Nj) \times Nj]}{\sum_{j=1}^{z} W(Nj)}$$

Where:
Nth'$_{\Delta tk}$: is the new threshold calculated for the interval Δtk,
S$_{\Delta t(k-1)}$: is the weighted average of the measurements Ni during the interval Δt(k−1),
S$_{\Delta t(k-2)}$: is the weighted average of the measurements Nj during the interval Δt(k−2),
W(Ni): is the weighting assigned to the ith measurement Ni of the capacitance Ce,
W(Nj): is the weighting assigned to the jth measurement Ni of the capacitance Ce,
Ni: is the ith measurement of the capacitance Ce,
Nj: is the jth measurement of the capacitance Ce,
X: is the number of measurements during the interval Δt(k−1),
Z: is the number of measurements during the interval Δt(k−2),
A: is a constant greater than or equal to 0, for example between 6 and 30,
K: is a constant greater than 0, for example between 2 and 50.

This is illustrated in FIG. 5.

The new threshold $Nth'_{\Delta t3}$ that is applied during the time interval $\Delta t3$ is calculated from the weighted average $S_{\Delta t2}$, calculated during the previous interval $\Delta t2$, to which a constant A is added.

The weighted average $S_{\Delta t2}$ is the average of the X measurements Ni of variation in the capacitance Ce during the interval $\Delta t2$, to which measurements a weighting W(Ni), that is to say a coefficient, is assigned, that is to say:

$$S_{\Delta t2} = \frac{\sum_{i=1}^{x}[W(Ni) \times Ni]}{\sum_{i=1}^{x} W(Ni)}$$

The weighting coefficient W(Ni) for its part is calculated, for each measurement Ni, depending on the difference between said measurement Ni of variation in capacitance Ce and the weighted average Sots calculated at the previous instant $\Delta t1$, that is to say using the formula:

$$W(Ni) = 1 - \frac{1}{K} \times \left|\frac{Ni - S_{\Delta t1}}{S_{\Delta t1}}\right|$$

Where K is a constant greater than 0.
And:

$$S_{\Delta t1} = \frac{\sum_{i=1}^{z}[W(Nj) \times Nj]}{\sum_{i=1}^{z} W(Nj)}$$

For the sake of simplicity, it is considered that the time intervals have equal durations, $\Delta t1=\Delta t2=\Delta t3$, and therefore the number of measurements, X, Z in each interval are also equal to one another, that is to say X=Z.

The method according to an aspect of the invention thus makes it possible to assign a high weighting for measurements having a small gap with respect to the weighted average calculated at the previous interval and a low weighting for measurements having a large gap with respect to the weighted average calculated at the previous interval.

Specifically, measurements having a large gap with respect to the weighted average calculated at the previous interval are certainly measurements that are disturbed by noise. By assigning them a low weighting, the new threshold Nth' is less affected by these stray measurements.

In FIG. 5, the new threshold $Nth'_{\Delta t3}$ applied during the interval $\Delta t3$ is higher than the threshold Nth, calculated using the method from the prior art.

During the interval $\Delta t3$, the variation measurements remain lower than the new threshold $Nth'_{\Delta t3}$, and no approach detection is confirmed, in contrast to the prior art.

The new adaptive threshold $Nth'_{\Delta tk3}$ is applied to the measurements of variation N in capacitance Ce for an interval $\Delta t3$ of predetermined duration.

Once this duration has expired, the method restarts for the following interval $\Delta t'$ (not shown), a new adaptive threshold $Nth'_{\Delta tk4}$ is calculated depending on the weighted average $S_{\Delta t3}$, calculated during the previous interval $\Delta t3$, to which a constant A is added.

The weighted average. $S_{\Delta t3}$ then is the average of the Y measurements Nm of variation (not shown in FIG. 5) of the capacitance Ce during the interval $\Delta t3$, to which there is assigned a weighting W(Nm), which for its part is calculated for each measurement Nm, depending on the difference between said measurement Nm of variation in capacitance Ce and the weighted average $S_{\Delta t2}$ calculated at the previous instant $\Delta t2$.

In one preferred embodiment, the time intervals $\Delta t(k-2)$, $\Delta t(k-1)$ used to calculate the new adaptive threshold $Nth'_{\Delta tk3}$ all have identical durations, for example between 0.5 and 10 seconds, preferably $\Delta t(k-2)=\Delta t(k-1)=3$ seconds.

In a second embodiment of the invention, the time intervals $\Delta t(k-2)$, $\Delta t(k-1)$ used to calculate the new adaptive threshold $Nth'_{\Delta tk3}$, as well as the time interval for applying the new threshold, that is to say $\Delta tk$, all have identical durations.

In other words, the new adaptive threshold Nth' is calculated at a set frequency f, being equal to:

$$f = \frac{1}{(\Delta tk)}$$

Of course, said time intervals $\Delta t(k-2)$, $\Delta t(k-1)$, $\Delta tk$ may vary in terms of duration and have different durations from one another.

The method of an aspect of the invention therefore expediently makes it possible to reduce the weighting of stray measurements in the calculation of the average of the measurements, used to define the detection threshold.

With the method of an aspect of the invention, false detections, triggered by the capacitance measurements moving above the detection threshold, these being caused by an abnormal drop in the measurements stemming from electromagnetic or other noise, are avoided. An aspect of the invention also makes it possible to avoid lack of detection of approach, if the disturbance creates an abnormal increase in the capacitance variation measurement signal.

The detection method of an aspect of the invention therefore makes it possible to considerably improve the accuracy and the reliability of the sensor.

The invention claimed is:

1. A method for detecting the approach and/or contact of a user's hand close to a motor vehicle door handle, said handle comprising:
   an electrode having a capacitance, and
   a device for measuring a variation in said capacitance,
   a low-frequency antenna situated close to the electrode, emissions of said low-frequency antenna bringing about disturbances in the operation of the device for measuring the variation in the capacitance,
   the method comprising:
   calculating a new adaptive approach detection threshold, depending on an average of previous measured variations in said capacitance, calculating over a predetermined time interval, said measured variations being weighted by a factor depending on a difference between each measured variation and the average of the variations calculated previously over a previous predetermined time interval, the approach detection being confirmed if the measured variation in said capacitance is higher than the new adaptive threshold.

2. The detection method as claimed in claim 1, wherein the new adaptive threshold is calculated at a set frequency.

3. The detection method as claimed in claim 1, wherein the predetermined time interval and the previous predetermined time interval have equal durations.

4. A capacitive sensor for detecting the approach and/or contact of a user's hand toward a motor vehicle door handle, said sensor comprising:
   an electrode having a capacitance, and
   a device for measuring a variation in said capacitance,
   a low-frequency antenna situated close to the electrode, emissions of said low-frequency antenna bringing about disturbances in the operation of the device for measuring the variation in the capacitance,
   means for calculating a new adaptive approach detection threshold depending on an average of the measured variations in said capacitance, calculated over a time interval, said measured variations being weighted by a factor depending on a difference between each measured variation and the average of the measured variations calculated previously over a previous predetermined time interval, and
   means for comparing between the variation in said capacitance and the adaptive threshold in order to confirm the approach detection in order to confirm the approach detection.

5. A motor vehicle comprising a sensor as claimed in claim 4.

6. A module for detecting the approach and/or contact of a user's hand toward a motor vehicle door handle, said module comprising
   a capacitive sensor comprising:
      an electrode having a capacitance, and
      a device for measuring a variation in said capacitance, and
   a low-frequency antenna situated close to the electrode, the emissions of said low-frequency antenna bringing about disturbances in the operation of the device for measuring the variation in the capacitance,
   means for calculating a new adaptive approach detection threshold depending on an average of the measured variations in said capacitance, calculated over a time interval, said measured variations being weighted by a factor depending on a difference between each measured variation and the average of the measured variations calculated previously over a previous predetermined time interval, and
   means for comparing between the variation in said capacitance and the adaptive threshold in order to confirm the approach detection in order to confirm the approach detection.

7. The detection module as claimed in claim 6, wherein the calculating means and the comparison means take the form of software integrated into a microcontroller.

8. A motor vehicle comprising a detection module as claimed in claim 7.

9. A motor vehicle comprising a detection module as claimed in claim 6.

* * * * *